US011293089B2

(12) United States Patent
Yalamanchili et al.

(10) Patent No.: US 11,293,089 B2
(45) Date of Patent: Apr. 5, 2022

(54) HIGH TEMPERATURE STABLE COMPOSITIONALLY MODULATED HARD COATINGS

(71) Applicant: Oerlikon Surface Solutions AG, Pfäffikon, Pfäffikon (CH)

(72) Inventors: Siva Phani Kumar Yalamanchili, Sargans (CH); Mirjam Arndt, Bad Ragaz (CH); Juergen Ramm, Muhlebundtestrasse (CH); Siegfried Krassnitzer, Walenstadt (AT); Denis Kurapov, Walenstadt (CH)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 55 days.

(21) Appl. No.: 16/485,384

(22) PCT Filed: Feb. 13, 2018

(86) PCT No.: PCT/EP2018/000058
§ 371 (c)(1),
(2) Date: Aug. 12, 2019

(87) PCT Pub. No.: WO2018/145815
PCT Pub. Date: Aug. 16, 2018

(65) Prior Publication Data
US 2019/0376174 A1 Dec. 12, 2019

Related U.S. Application Data

(60) Provisional application No. 62/458,088, filed on Feb. 13, 2017.

(51) Int. Cl.
*C23C 14/06* (2006.01)
*C23C 14/02* (2006.01)
(Continued)

(52) U.S. Cl.
CPC ........ *C23C 14/0641* (2013.01); *C23C 14/024* (2013.01); *C23C 14/3485* (2013.01); *C23C 30/005* (2013.01); *C23C 14/35* (2013.01)

(58) Field of Classification Search
CPC ... B23B 27/14; B23B 27/148; C23C 14/0641; C23C 14/024; C23C 14/3485
(Continued)

(56) References Cited

U.S. PATENT DOCUMENTS

2011/0111197 A1    5/2011  Johansson et al.
2015/0064452 A1*   3/2015  Pitonak .............. B23B 27/148
                                                        428/336
2017/0021429 A1*   1/2017  Paseuth ................ C23C 16/52

FOREIGN PATENT DOCUMENTS

WO       2012069475 A1    5/2012

OTHER PUBLICATIONS

Kumar Yalamanchili, et al., Growth and thermal stability of TiN/ZrAlN: Effect of internal interfaces, Acta Materialia, vol. 121, 2016, pp. 396-405 (Year: 2016).*
(Continued)

*Primary Examiner* — Archene A Turner
(74) *Attorney, Agent, or Firm* — Polson Intellectual Property Law, PC; Margaret Polson; Christopher Sylvain

(57) ABSTRACT

The present invention relates to a component comprising a substrate coated with a coating having a film (3,4 or 3,4,5) comprising one or more transition metals, TM, aluminium, Al, and nitrogen, N, wherein the TM and N as well as Al and N are comprised in the film forming respectively nitride compounds, wherein the transition metal nitride, TM-N, is present in the film distributed in different portions exhibiting one crystalline phase of TM-N, and the aluminium nitride, Al—N, is present in the film in different portions exhibiting one phase of Al—N, whereas the phase of the transition metal nitride is cubic, c-TMN, the phase of the aluminium
(Continued)

nitride is wurtzite, w-AlN, and wherein the film exhibits coherent or (semi-) coherent interfaces between the c-TMN phase portions and the w-Al-N phase portions.

23 Claims, 12 Drawing Sheets

(51) Int. Cl.
 *C23C 14/34* (2006.01)
 *C23C 30/00* (2006.01)
 *C23C 14/35* (2006.01)
(58) Field of Classification Search
 USPC .......................................................... 428/698
 See application file for complete search history.

(56) References Cited

OTHER PUBLICATIONS

Todt et al "Superior oxidation resistence, mechanical properties and residual stress of Al-rich nanolamellar Ti(0.05)Al(0.95)N coating prepared by CVD" Surface & Coating Technology 258 p. 119-1127. (Year: 2014).*
Keckes et al "Self-roganized soft-hard nanolamellae in polycrytalline TiAlN thin films" Thin Solid Films 545 p. 29-32. (Year: 2013).*
International Search Report dated Aug. 16, 2018 in parent International application PCT/EP2018/000058.
Written Opinion of the International Searching Authority dated Aug. 16, 2018 in parent International application PCT/EP2018/000058.
Yalamanchi Li Kumar et al: 11 Growth and 1.4 thermal stability of TiN/ZrAlN: Effect of internal interfaces, Acta Materialia, Elsevier, Oxford. GB, vol. 121, Sep. 16, 2016 (Sep. 16, 2016), pp. 396-406, XP029775635, ISSN: 1359-6454, DOI: 10.1016/J.ACTAMAT.2016.07.006.
Greczynski G et al: "Role of Tin+ and Aln+ ion irradiation (n=1. 2) during Ti1-xAlxN alloy film growth in a hybrid HIPIMS/magnetron mode", Surface and Coatings Technology, Elsevier BV, Amsterdam, NL, vol. 206, No. 19, Apr. 9, 2012 (Apr. 9, 2012), pp. 4202-4211, XP028508708, ISSN: 0257-8972, DOI: 10.1016/J.SURFCOAT.2012.04.024 [retrieved on Apr. 19, 2012].
Greczynski G et al: "A review of metal-ion-flux-controlled growth of metastable TiAlN by HIPIMS/DCMS co-sputtering", Surface and Coatings Technology, vol. 257, Feb. 4, 2014 (Feb. 4, 2014), pp. 15-25, XP029080256, ISSN: 0257-8972, DOI: 10.1016/J.SURFCOAT.2014.01.055.
Riedl H et al: "Phase stability, mechanical properties and thermal stability of Y alloyed Ti—Al—N", Surface and Coatings Technology, vol. 235, Jul. 18, 2013 (Jul. 18, 2013), pp. 174-180, XP028749527, ISSN: 0257-8972, DOI: 10.1016/J.SURFCOAT.2013.07.030.
Szekely L et al: "Crossover of texture and morphology in (Ti1-xAlx)1-yYyN alloy films and the pathway of structure e", Surface and Coatings Technology, vol. 257, Sep. 6, 2014 (Sep. 6, 2014), pp. 3-14, XP029080288, ISSN: 0257-8972, DOI: 10.1016/J.SURFCOAT.2014.08.071.
Todt J et al: "Al-rich cubic Al0.8Ti0.2N coating with self-organized nano-lamellar microstructure: Thermal and mechanical properties", Surface and Coatings Technology, Elsevier BV, Amsterdam. NL, vol. 291, Feb. 12, 2016 (Feb. 12, 2016), pp. 89-93. XP029493081, ISSN: 0257-8972, DOI: 10.1016/J.SURFCOAT.2016.02.027.
Wu Wan-Yu et al: "Effect of DC input power and nitrogen ratio on the deposition of Ti1-xAlxN thin films using high power impulse magnetron sputtering technique", Surface and Coatings Technology, Elsevier BV, Amsterdam. NL, vol. 303, Mar. 18, 2016 (Mar. 18, 2016), pp. 48-53. XP029695526, ISSN: 0257-8972, DOI: 10.1016/J.SURFCOAT.2016.03.050.

* cited by examiner

HIGH TEMPERATURE STABLE COMPOSITIONALLY MODULATED HARD COATINGS

The present invention relates to a method for producing substrates coated with a coating, which is a compositionally modulated coating, in particular a PVD hard coating, with self-adapted coherent interfaces and preferably diffusion barrier interfaces, wherein the surface of the substrate being coated can be a polycrystalline substrate surface. The coatings produced according to the present invention exhibit mechanical and chemical stability at high temperatures. In the context of the present in invention, the terms "high temperatures" or "elevated temperatures" are used for referring to temperatures of at least 800° C. and above 800° C., in particular for referring to temperatures between and including 900° C. and 1100° C.

Physical vapor deposition (PVD) is a well-known technology used for deposition of hard and wear resistant coatings for improving performance of tools and components. The PVD nitride, oxide and carbide based hard coatings are well known. However, there is still a big demand for hard coatings that can exhibit high wear resistance at elevated temperatures. This could be achieved by hard coatings that exhibit structural and chemical stability at elevated temperatures. This stability of the hard coatings should preferably involve high hot hardness, it means high hardness at elevated temperatures. In the context of the present invention the term "high hot hardness" is used for referring to values of hardness of about 32 to 40 GPa measured after exposition of the hard coating to elevated temperatures or measured insitu at elevated temperatures.

In the context of the present invention the term structural and chemical stability is referred to retaining the pristine coherent interface structure, and retaining the resistance to environmental degradation such as oxidation, respectively.

It is known that nitrides of transition metals can be produced as coating material, forming metastable phases, under non-equilibrium growth conditions by PVD processes (hereafter the acronyms "TM" and "TMN" will be used for referring to "transition metal" and "transition metal nitride", respectively).

For example, it has been observed that aluminum nitride, Al—N, can be formed by using binary alloys, such as Ti—Al, Cr—Al, V—Al and Nb—Al, as source material for conducting a PVD process (the source material can be used for example as cathode by operating a magnetron sputtering source or an arc vaporization source, so that a surface of the source material is sputtered or vaporized during operation of the source) for forming Ti—Al—N, Cr—Al—N, V—Al—N, and Nb—Al—N coatings, respectively, in a vacuum atmosphere comprising nitrogen as reactive gas. In this manner Al—N can be formed in a metastable cubic solid solution comprising a portion of cubic aluminum nitride, c-AlN, of for example up to 60-70 at. % (at. % means atomic percent), as it has been reported by different authors, for example by Rovere et al in their scientific article entitled "Experimental and computational study on the effect of yttrium on the phase stability of sputtered Cr—Al—Y—N hard coatings" published in Acta Mater. 58 (2010) 2708-2715, by Knutsson at al in their scientific article entitled "Thermally enhanced mechanical properties of arc evaporated $Ti_{0.34}Al_{0.66}N$/TiN multilayer coatings" published in J. Appl. Phys. 108 (2010) 0-7, or by Reiter et al in their scientific article entitled "Investigation of the properties of $Al_{1-x}Cr_xN$ coatings prepared by cathodic arc evaporation" published in Surf. Coatings Technol. 200 (2005) 2114-2122.

It is known that a metastable cubic phase enables superior mechanical and wear properties. This is for example the case of the metastable cubic phase of titanium aluminum nitride (c-TiAlN). However, c-TiAlN undergoes isostructural decomposition to cubic titanium nitride (c-TiN) and cubic aluminum nitride (c-AlN) by spinodal decomposition. This is for example explained by Mayrhofer et al in their scientific article entitled "Self-organized nanostructures in the Ti—Al—N system" published in Appl. Phys. Lett. 83 (2003) 2049-2051. The mentioned isostructural decomposition results in further hardness enhancement by additional strengthening mechanisms, such as Coherency and Koehler strengthening as it is shown in FIG. 1, which leads to superior wear resistance. This phenomenon is also explained by Hörling et al in the patent document U.S. Pat. No. 7,056,602B2 and in their scientific article entitled "Thermal stability of arc evaporated high aluminum-content $Ti_{[1-x]}Al_{[x]}N$ thin films" in J. Vac. Sci. Technol. A Vacuum, Surfaces, Film. 20 (2002) 1815.

It is also well known that coatings consisting or comprising metastable solid solutions, which comprise or consist of one or more metastable cubic phases of a nitride of aluminum and at least one transition metal undergo a phase transformation at elevated temperatures. This kind of metastable cubic phases will be referred in the context of the present invention as c-TM-Al—N phases. This formula (c-TM-Al—N) refers to a cubic transition metal aluminum nitride, where TM is one or more transition metals, Al is aluminum and N is nitrogen, and indicates a nitride of Al and TM in a cubic phase. As mentioned above, c-TM-Al—N phases usually undergo a phase transformation at elevated temperatures, in particular at temperatures above 900° C., leading to a thermodynamic equilibrium mixture of c-TMN and w-AlN phases (c-TMN indicates a cubic phase of a nitride of the one or more transition metals and w-AlN indicates a wurtzite phase of aluminum nitride). This transformation results in an undesirable hardness drop and volumetric instability, and thereby in a loss of wear resistance.

To overcome this disadvantage observed in coating materials consisting of or comprising one or more c-TM-Al—N phases, several material design concepts have been pursued to enhance the stability regime of metastable cubic phases. In this regard, for example in the patent applications US2011111197A1 and WO2012069475A1, it is suggested to use multilayering and multicomponent alloying design concepts. However, the use of these concepts is limited to applications, in which the coatings are exposed to temperatures below 1000° C., because at a temperature of 1000° C. or above 1000° C., the formation of a mixture of phases in equilibrium, comprising c-TMN and w-AlN phases is inevitable and it leads to an inevitable hardness drop as mentioned previously. These coatings suffer additionally a volumetric instability related to a molar volume expansion of about 20% that is caused by the phase transformation of AlN from cubic phase to wurtzite phase.

Very recently, Yalamanchili et al explain in their scientific article entitled "Growth and thermal stability of TiN/ZrAlN: Effect of internal interfaces" published in Acta Mater. (2016) 1-11 that wear resistant hard films being formed of c-TMN and c-AlN phases, disposed in such a manner that they exhibit coherent interfaces, have a confined operating envelope governed by the limited thermal stability of metastable phases. However Yalamanchili et al propose producing coating materials that are formed of a mixture of equilibrium phases e.g. c-TMN and w-AlN, but disposed in such a manner that the phases are deposited exhibiting coherent or (semi-) coherent interfaces (the term "(semi-) coherent interfaces" is used in the context of the present invention for referring to non-isostructural partly coherent interfaces), which are formed during film growth in order to overcome the above-mentioned problems (involving phase transformation of AlN from cubic phase to wurtzite phase) and offer higher thermal stability. With this purpose Yalamanchili et al produced and examined multilayer systems made of TiN and ZrAlN films, wherein the latter film was produced comprising ZrN-rich and AlN-rich domains. The analysis of the above-mentioned films showed the synthesis of cubic zirconium nitride (c-ZrN) and wurtzite aluminum nitride (w-AlN) phases and the formation of non-isostructural coherent or (semi-) coherent interfaces. However, the approach proposed by Yalamanchili et al involve the disadvantages that the films comprising non-isostructural (semi-) coherent interfaces between the c-ZrN and the w-AlN can only be grown at a high substrate temperature of at least 900° C. and only on substrates exhibiting a single crystal surface. This severely restricts the choice of substrate materials.

A further disadvantage of the above-mentioned in-plane modulated structure as proposed by Yalamanchilia et al, is the formation of diffusion paths between the adjacent c-ZrN and w-AlN domains. This causes a domain coalescence, which results in an increased domain size, when the coating is exposed to elevated temperatures for a long time. For example, if the coating must be exposed to a temperature beyond 800° C. for long durations of 10 hours or more such as hot metal stamping die. In such a case, the increased domain size can cause an increased strain energy that leads to a coherency break down and consequently a hardness drop. In addition, a lower oxidation resistance of c-TiN, and c-ZrN make these structures not suitable for ambient atmospheres at elevated temperatures above 800° C.

For the reasons mentioned above, it seems to be that the mentioned proposed solution for achieving enhanced thermal stability of TiN/ZrAlN coatings by using the concept of designing in-plane modulated structures seems to be not appropriate in the presented form for providing tools and components with protective coatings, because:
on the one hand, the tools and components normally comprise polycrystalline surfaces, and
on the other hand, tools and components are normally subjected to a prolonged exposition to elevated temperatures of above 900° C.

Objective of the Present Invention

It is an objective of the present invention to provide a coating that grows on material surfaces, in particular on polycrystalline material surfaces, and comprises at least one film consisting of at least one TMN and at least one AlN phase, which exhibit a high hot hardness and structural and chemical stability at elevated temperatures (it means for example concretely in the context of the present invention a hardness H>32 GPa, at a temperature between 800° C. and 1100° C.).

It is a further objective of the present invention to provide a method for producing tools or components having a polycrystalline surface coated with an inventive coating as mentioned above.

The objectives of the present invention are attained by providing a coating produced on polycrystalline surfaces by using a method which allows forming a thermally stable in-plane and out-of-plane chemically modulated structures with self-adapted coherent and diffusion barrier interface.

Description of the Present Invention

The method according to the present invention involves producing a coating comprising at least one compositional and structural modulated coating consisting of c-TMN and w-AlN phases with self-adapted coherent interfaces and preferably diffusion barrier interfaces between the phases. The coating can be deposited on polycrystalline substrates.

The above-mentioned method according to the present invention is preferably carried out by maintaining a substrate temperature of maximum 600° C., preferably of below 500° C.

According to the present invention, the modulated structures must be formed exhibiting one of the three coherent orientations between the c-TMN and w-AlN phases, it means the orientation c-(111)/w-(0001), or c-(110)/w-(10-10), or c-(110)/w-(11-20), as they are shown in FIG. 2.

The inventors observed that it was not possible to form such structures on surfaces of polycrystalline materials by using known physical vapor deposition techniques. Therefore, the inventors had the idea of depositing a w-AlN layer as seed layer that exhibits the desired crystallographic orientation w-(0001), or w-(10-10), or w-(11-20). These seed layer was deposited as under layer, before starting of the growth of the modulated structure. The inventors found surprisingly that a thickness of between 30 and 100 nm of the above-mentioned seed layer was enough for promoting growing of the modulated structures as above-mentioned, in spite of using PVD techniques for depositing the coating on surfaces of polycrystalline material substrates.

The seed layer is formed by establishing the appropriate thermodynamic and kinetic conditions on the growth front i.e. a substrate bias between 30 V and 300 V, target power density of 0.1 kW/cm$^2$ to 10 kW/cm$^2$, working pressure between 0.2 Pa and 10 Pa, magnetic field with a parallel component between 100 G and 1000 G, target to substrate distance between 50 mm and 200 mm and substrate temperature between 400° C. and 600° C.

According to a preferred embodiment of the present invention the modulated coating structure consisting of c-TMN and w-AlN phases with a volume fraction between 70% and 100% is synthesized in a co-deposition method. In this manner, the incident flux of TM and the incident flux of Al are co-deposited, forming the mixture of c-TMN and w-AlN phases on the previously grown seed layer to form the in-plane modulated coatings as shown in FIGS. 3a and 3b. FIG. 3a shows the cross-sectional view, and 3b shows plan view of the in-plane modulated structure consisting of c-TMN and w-AlN with coherent interfaces The inventors found surprisingly that a key requirement for producing this inventive coating structure is to attain a sufficiently high adatom mobility on the growth front, i.e an adatom mobility above 50 nm/s. According to a preferred embodiment of the present invention, the sufficiently high adatom mobility is achieved by attaining a high plasma density by using a HIPIMS deposition methods, preferably using power/current densities higher than 750 w/cm$^2$/0.8 A/cm$^2$. For example, by using the S$^3$P technology of the company Oerlikon Balzers. The high plasma density is also achieved by using an arc evaporation process or even by combining both the arc evaporation and S$^3$P process. According to a further preferred embodiment of the present invention, the sufficiently high adatom mobility is achieved by applying an asymmetric bipolar pulsed bias at the substrate. In the last case, the bipolar pulsed bias consists preferably of a positive and a negative cycle, wherein the bias voltage has a value that can vary between 10 V and 100 V during the positive cycle, and can vary between 20 V and 40V during the negative cycle, wherein the frequency is maintained preferably between 50 kHz and 500 kHz, so that the incident adatom has sufficient kinetic energy for promoting a local epitaxial growth.

In the last embodiment, the electrons are electrostatically driven to the substrate during the positive cycle, causing in this manner a joule heating and thereby accelerating the temperature on the growth front very locally while keeping the overall substrate at a relatively low temperature which can be around 500° C.

The maximum local temperature and the temperature gradient across the coating is tuned by the positive pulse time, positive bias voltage, shape of the pulse, frequency of the pulsed bias, plasma density, and local composition at the growth front.

According to a further preferred embodiment of the present invention, the adatom mobility is further enhanced by using surfactants such as In, Ga, $H_2$ and a combination of them, which are added in a controlled manner, in a proportion between 0.1 and 5% of the incident flux volume.

A sufficiently high adatom mobility achieved by using a deposition method according to any of the above-mentioned embodiments of the present invention causes surface segregation of immiscible components on the growth front and results in formation of c-TMN and w-AlN domains with a size in few nanometers In a preferred embodiment of a coating produced according the present invention, the c-TMN and w-AlN domains are formed having a size between 5 nm and 20 nm.

The following section explains the formation of the self-organized in-plane modulated structure in the invention.

The nanoscale segregated structure comprised of c-TMN and w-AlN domains is characterized with a high interface material volume up to 50% that leads to a high interface energy. The interface energy minimization provides the thermodynamic driving force for the segregated domains to form coherent interfaces. The combined thermodynamic and kinetic conditions favor the adatoms to inherit the crystallographic orientation of the seed layer such a way they can form coherent interfaces between the in-plane modulated c-TMN and w-AlN domains. The inheritance of the coherent interfaces between the non iso-structural domains of c-TMN and w-AlN in the growth direction leads to formation of self-aligned modulated structure as shown in FIG. 3 $a$ and $b$. The domain composition of the c-TMN can be c-TiN, c-ZrN, c-VN, c-NbN or a combination of them such a way that the misfit strain with w-AlN domains is reduced to less than 2%. This is specific for each crystallographic coherent orientation shown in FIG. 2.

However, in the in-plane modulated structure, both the c-TMN and w-AlN domains have diffusion path to their neighbors as shown in FIG. 3 $b$. This causes domain coalescence at elevated temperature after sufficient time and eventually the domain size is large enough to cause a high strain energy that leads to coherency break down.

To overcome this issue, the inventors proposes to grow self-adapted diffusion barrier layer consisting of SiN, BN, and WN at the interfaces between the c-TMN and w-AlN domains with a thickness between 1 monolayer and 5 monolayers as shown in FIG. 3 $c$, and $d$. SiN, BN, and WN are immiscible to both c-TMN and w-AlN, and controlled alloying (3 to 10 at. %) to both c-TMN and w-AlN leads to the evolution of the proposed self-adapted diffusion barrier layer. The diffusion barrier layer forms either during the growth, aided by the accelerated surface diffusion under the proposed growth conditions or during the application, aided by the bulk diffusion at elevated temperature.

The diffusion barrier layer confines the c-TMN and w-AlN domains (FIG. 3 $d$) and the coherent interface display a high thermal stability at elevated temperatures above 1100° C. for prolonged exposure of above 20 hrs. The thermally stable coherent interface structure between the non-isostructural domains of c-TMN and w-AlN causes stable hardness up to the elevated temperature of 1100° C. for prolonged exposure.

Furthermore, the self-adapted diffusion barrier layer generates local fluctuations in shear modulus that hinder the dislocation motion and there by enables further hardness enhancement. The diffusion barrier layer composition is tuned such a way to form a protective oxide layer consisting of $SiO_2$ in ambient atmosphere at elevated temperature to induce high oxidation resistance of the coating.

The present invention discloses also the growth out-of-plane modulated structure with self-adapted coherent interface and diffusion barrier layer on a poly crystalline substrate as shown in FIG. 4. There are three crystallographic planes that have similar in-plane symmetry between the c-TMN and w-AlN phases, i.e. c(111)/w(0001), c(110)/w (10-10), and c(110)/w(11-20) as shown in FIG. 2. A seed layer of w-AlN with a thickness between 30 to 100 nm with a required crystallographic orientation. i.e. w-(0001), w-(10-10) and w-(1120) is grown on a poly crystalline substrate as described previously. Subsequently, the incident flux is modulated between c-TMN and w-AlN to a controlled thickness between 10 and 30 nm. The composition of the c-TMN layer is varied between c-TiN, c-ZrN, c-VN, and c-NbN or a combination, such a way that the misfit strain with w-AlN is less than 2%. The high adatom mobility under the combined effect of surfactants and the bipolar pulse induced local atomic scale heating growth conditions presented above facilitate the inheritance of the specific crystallographic orientation from the seed layer to c-TMN layer and subsequently to the next w-AlN, as shown in FIG. 4 driven by the interface energy minimization. The c-TMN and w-AlN are immiscible, so the layer thickness is confined even at elevated temperature for prolonged exposure, for ex: 1100° C., 20 hrs.

The coatings disposed in the proposed growth layout, the coherent interfaces are thermally stable both in the in-plane and out-of-plane modulated structure (FIG. 3$c$, and FIG. 4) that leads to the hardness behavior as shown in FIG. 5. Furthermore, a controlled addition of SiN, BN, and WN in TMN layer and w-AlN causes self-adapted interface layer formation between c-TMN and w-AlN layers as explained before. The segregated layer induces additional strengthening by causing hindrance to the gliding dislocations, and offers as a diffusion barrier layer to the oxidation process at elevated temperature in ambient atmosphere.

The nitrogen sublattice of the TM-Al—N modulated structure is replaced with oxygen between 1 at. % and 20 at. % to favor the proposed growth layout, and to tune the elevated temperature hardness, and oxidation resistance.

In summary, the proposed structure of in-plane and out-of-plane modulated structure with self-adapted coherent interface and diffusion barrier layer offers a high thermal stability, volumetric stability, and oxidation resistance in the TM-Al—N coatings and other oxide, and carbide based hard coatings. The combined effect of surfactants and bi-polar pulse induced local atomic scale heating provides the necessary ad atom mobility to achieve the proposed structure at a substrate temperature less than 600° C. Finally, this sophisticated structure is grown on a polycrystalline substrate by forming a seed layer with specific crystallographic orientation.

The present invention makes possible:
To enhance the oxidation resistance of the proposed growth layout by promoting a self-adapted diffusion barrier layer.
To achieve a stable coating hot hardness for transition metal aluminum nitride based coatings (e.g. of the type (Ti, V, Nb, Cr, Zr)—Al—N) as shown in FIG. 5, which results in improved wear resistance at elevated temperatures in the range between 800° C. and 1100° C., which is comparable with the wear resistance of oxide based coatings and carbide based coatings.
To achieve a high volumetric stability in TM-Al—N coatings and related Oxide, and Carbide based hard coatings.

The present invention discloses a method for achieving a stable coating hardness at elevated temperatures (hot hardness) hardness for Transition Metal (Ti, V, Nb, Cr, Zr)—Al—N that results in improved wear resistance at elevated temperatures in the range between 800° C. and 1100° C.
enhancing the thermal stability of coherent interfaced in-plane modulated structures, preferably obtaining at the same time a good oxidation resistance.

It is one further objective of the present invention to achieve a high volumetric stability in TM-Al—N coatings, preferably also in related oxide, and carbide based hard coatings The coherent interfaces according to the present invention can be detected by using Transmission electron microscopic (TEM) techniques. TEM images of the inventive nitride, carbide and oxide hard coatings reveal a characteristic SAED (selected area electron diffraction) patter and HR (high resolution).

TEM images can show coherent interfaces between the non-isostructural domains on polycrystalline substrate according to the present invention.

The present invention make possible to obtain new coating materials with stable hardness between 32 Gpa to 38 Gpa, in particular for for TM-Al—N and related coatings up to elevated temperature annealing of 1150° C.

Likewise, the inventive coatings are volumetrically stable coatings with no structural transformations and exhibit at the same time superior oxidation resistance.

The present invention will be explained more in detail by means of following figures and examples.

FIGURE CAPTION

FIG. 1: State of the art metastable c-TM-Al—N coating hardness vs annealing temperature.

FIG. 2: Crystallographic planes of c-TMN and w-AlN with similar in-plane geometrical symmetry.

FIG. 3: Graphical representation of the proposed growth layout on polycrystalline substrate, a) tilted cross-sectional view of in-plane modulated structure, b) plan view image revealing diffusion path for the coalescence, c) tilted cross-sectional view of in-plane modulated structure with self-adapted diffusion barrier layer, and d) plan view image showing the domain confinement.

FIG. 4: Graphical representation of out-of-plane modulated structure with self-adapted diffusion barrier layer on polycrystalline substrate FIG. 5: Graphical representation of the proposed modulated structure and hardness behavior as a function of annealing temperature.

FIG. 6: X-ray diffraction pattern of the multilayers of c-TiN Av-AlN on MgO 111 substrate with different period thickness in a Bragg-Brenteno geometry.

FIG. 7: N2 consumption as a function of total pressure (Ar and N2) at fixed Ar partial pressure of 0.2 Pa Ar. Letter T indicates a transition point where the target operation switches from metallic to compound mode.

FIG. 8: TEM Images of comparative coating 1, #1016, bright field image (a), and HR-TEM (b). Black arrow indicates incoherent interfaces. TEM images of inventive coating 1, #1019, bright field image (c), and HR-TEM image (d) showing c-TiN and w-AlN Continues lattice fringes between c-TiN and w-AlN layers in image d suggests coherent interfaces.

FIG. 9: XRD diffractograms and pole figures of comparative (FIG. 9a) and inventive coatings (FIG. 9b): The pole figures at 2e value of 36.6° correspond to diffraction peak positions of c-TiN 111 and w-AlN 0001 with a period thickness of 11 nm.

FIG. 10: Plasticity of c-TiN, and w-AlN, and multilayers of c-TiN/w-AlN of comparative coatings with incoherent interfaces (#1016, #1017, #1018), and inventive coatings with (semi-) coherent interfaces (#1019, #1020, #1021).

FIG. 11: Elastic modulus, E of c-TiN, and w-AlN, and multilayers of c-TiN/w-AlN of comparative coatings with incoherent interfaces (#1016, #1017, #1018), and inventive coatings with coherent interfaces (#1019, #1020, #1021).

FIG. 12: Hardness of c-TiN, and w-AlN, and multilayers of c-TiN/w-AlN of comparative coatings with incoherent interfaces (#1016, #1017, #1018), and inventive coatings with coherent interfaces (#1019, #1020, #1021).

Figure 1:
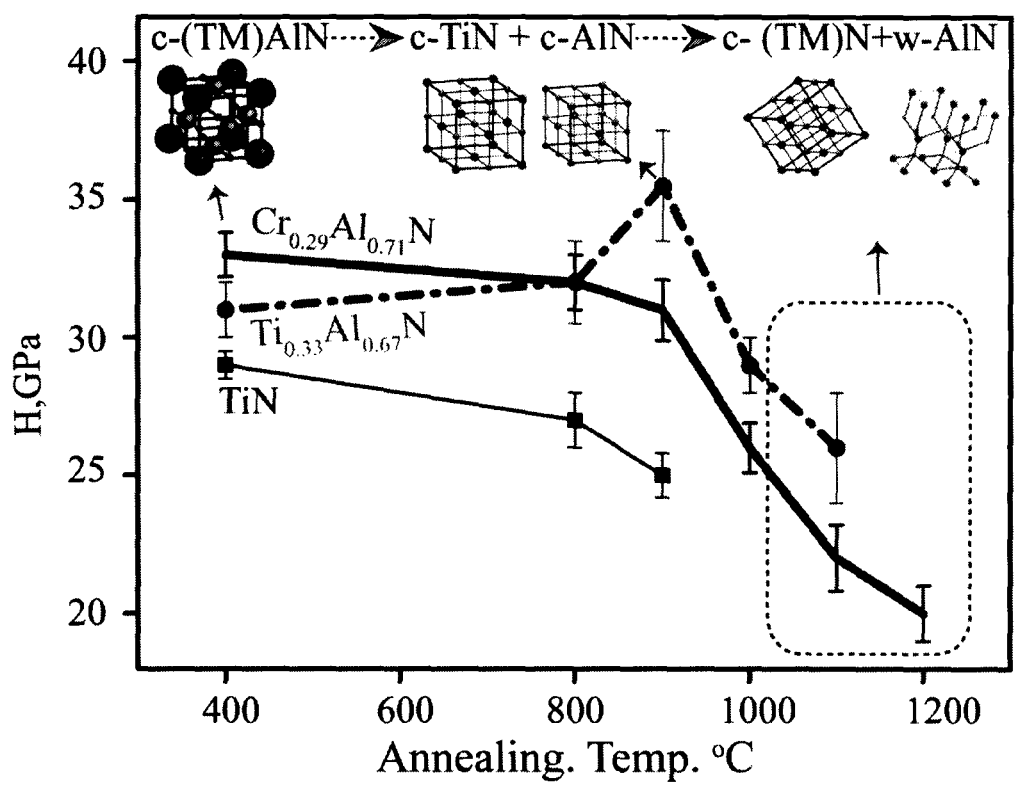
FIG. 1 shows the hardness as a function of annealing temperature for metastable c-TM-Al—N coatings according to the state of the art. This hardness vs. annealing temperature shows clearly that for these coatings the hardness drops at a temperature above 900° C.
Figure 2:
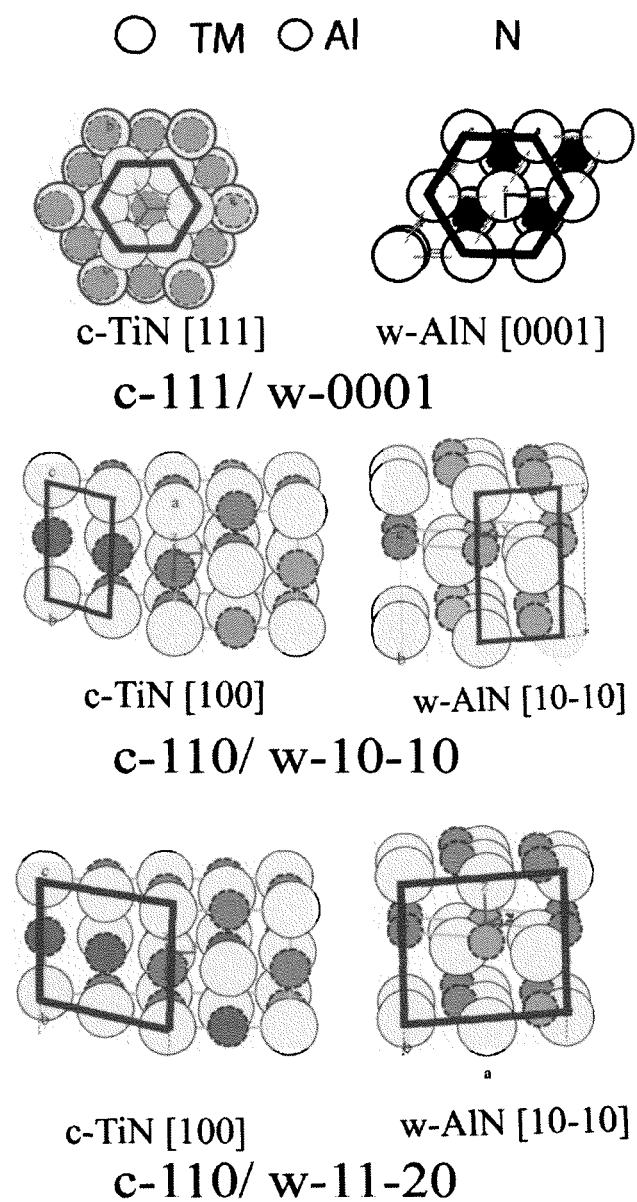
FIG. 2 shows crystallographic planes of c-TMN and w-AlN with similar in-plane geometrical symmetry.
Figure 3:
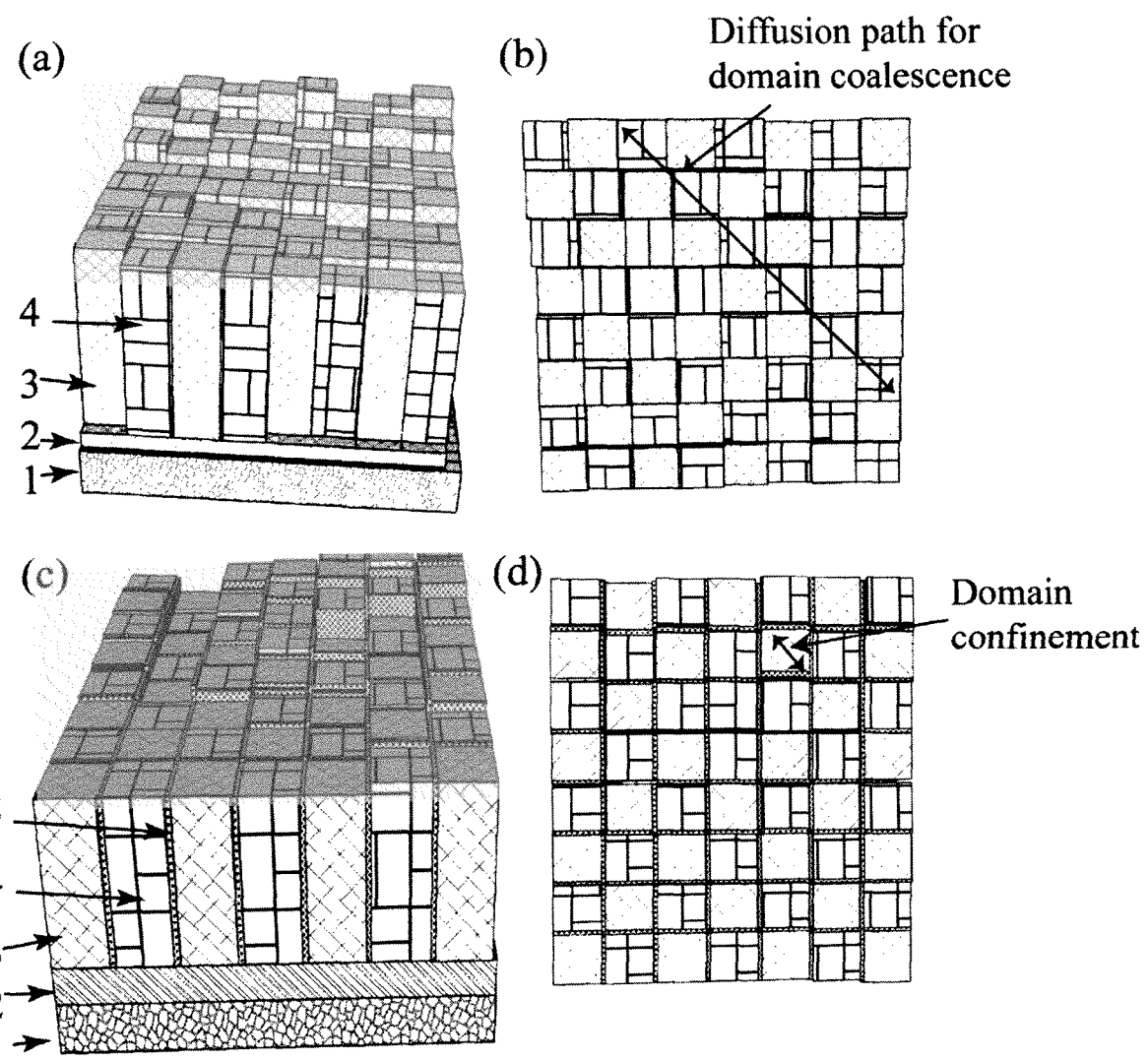

FIG. 3 shows a graphical representation of the proposed growth layout on polycrystalline substrate, a) tilted cross-sectional view of in-plane modulated structure, b) plan view image revealing diffusion path for the coalescence, c) tilted cross-sectional view of in-plane modulated structure with self-adapted diffusion barrier layer, and d) plan view image showing the domain confinement. Polycrystalline substrate 1, seed layer 2, c-TMN phase 3, w-AlN phase 4, and self-adapted diffusion barrier layer 5 are respectively represented in FIG. 3(a) and FIG. 3(c) for better explaining the structure proposed according to a preferred embodiment of the present invention.

Figure 4:
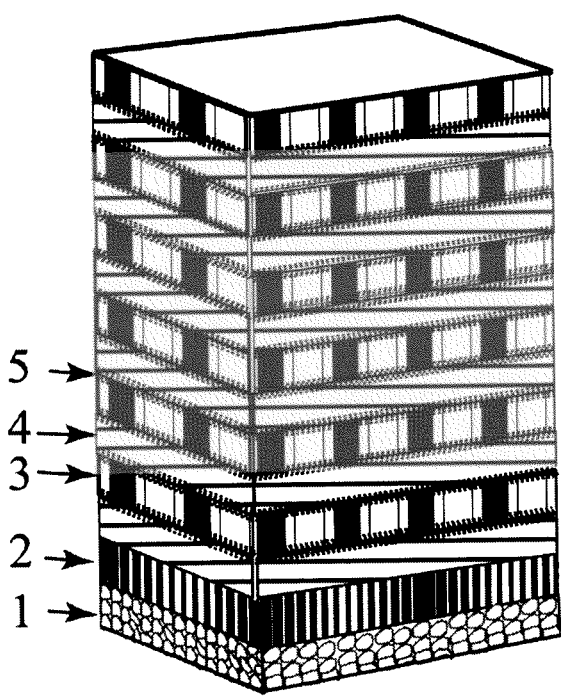

FIG. 4 shows a graphical representation of out-of-plane modulated structure with self-adapted diffusion barrier layer on polycrystalline substrate. Also in this figure polycrystalline substrate 1, seed layer 2, c-TMN phase 3, w-AlN phase 4, and self-adapted diffusion barrier layer 5 are respectively represented.

Figure 5:
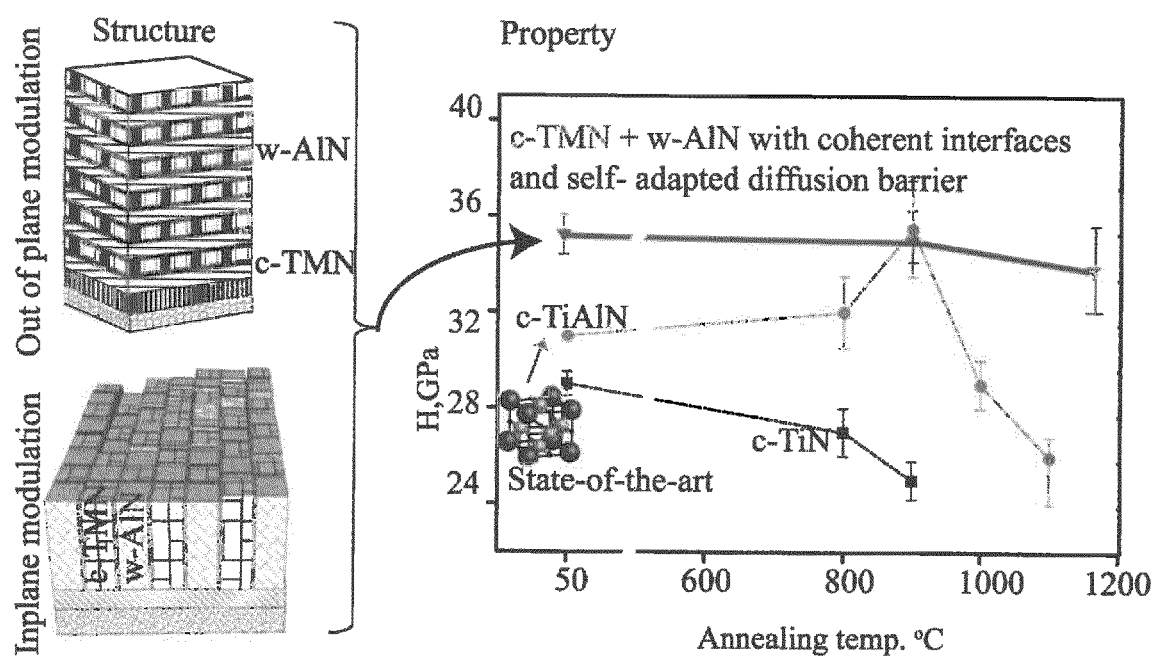

FIG. 5 shows the hardness behavior of the proposed modulated structure according to the present invention as a function of annealing temperature.

CONCRETE EXAMPLES FOR EXPLAINING THE PRESENT INVENTION IN MORE DETAIL

Different multilayer coatings according to the present invention were produced.

For example, multilayer c-TiN/w-AlN coatings comprising c-TiN phase and w-AlN phase were produced, which grew coherently under specific growth conditions by using a PVD method of the type High-Power Impulse Magnetron Sputtering process.

The used PVD process is a power regulated pulsed sputtering process, characterized by high power density up to 2 kW/cm2. This process is highly flexible where the peak power, average power, and pulse length can be varied independently. This process allows using very long pulse up to 100 ms even at a high-power density of 2 kW/cm2.

The inventors found surprisingly that by using the above-mentioned PVD process it is possible to influence the nature of the interfaces in multilayer coatings consisting of alternate deposited c-TMN and w-AlN layers for producing the inventive coatings by adjusting selected coating parameters within an inventive process parameters window.

In this manner it was possible to produce for example inventive multilayer coatings consisting of c-TiN and w-AlN layers deposited alternate one on each other exhibiting (semi-) coherent interfaces between the layers of c-TiN and w-AlN, even though their structure is different. The most important criteria for adjusting appropriate process parameters are described below, and the results are presented in FIGS. (6, 7,8 and 9) for both coatings deposited on single crystal substrate and coatings deposited on polycrystalline substrate.

Figure 7:
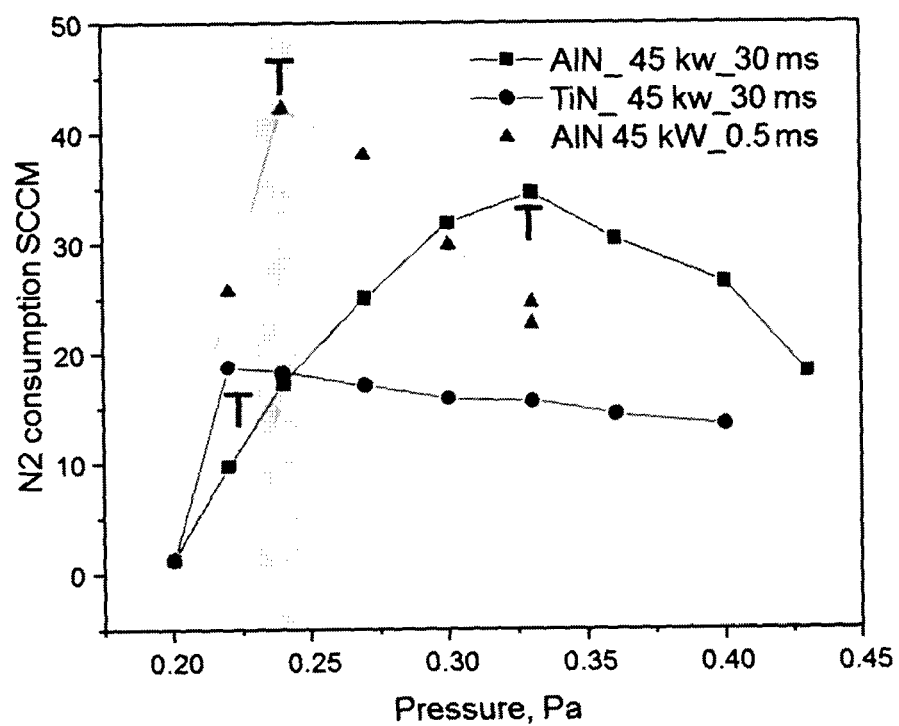

The first criterion is to adjust the coating parameters for each target for attaining a N2 consumption corresponding to a determined N2 partial pressure, at which both Ti and Al targets are operated in the transition mode between metallic and compound mode. FIG. 7 shows N2 consumption as a function of total pressure (Ar and N2) at a fixed Ar partial pressure of 0.2 Pa Ar. Letter T indicates for each target the transition point where the respective target operation switches from metallic to compound mode.

Due to differences in the reactivity between Ti, and Al targets with nitrogen, the transition from metallic to compound mode of target operation was found to be different, indicated as T in FIG. 7. The region of the curve beyond this point T for each target is the compound mode for the corresponding target.

The inventors adjusted the appropriate working N2 partial pressure by varying the pulse length and observed that surprisingly growth of multilayers with (semi-) coherent interfaces is achieved only when the N2 partial pressure allows operation of the targets in compound mode but close to the transition point.

Furthermore, the inventors recommend using parameters levels within the parameters window described below for producing the inventive coatings with (semi-) coherent interfaces:

1) A negative substrate bias with absolute value higher than 50 V but preferable below 100 V.
2) Sufficiently high substrate temperature, it means in particular in the context of the present invention a temperature not lower than 400° C.
3) Argon partial pressure of about 0.2 and N2 partial pressure between and including 0.05 and 0.08 Pa.
4) Using a cubic "template" layer TiN with a thickness of about 50 nm to nucleate (111) seed layer on a polycrystalline substrate.
5) O2 flow between 10 sccm and 20 sccm to promote textured growth.

Figure 6:
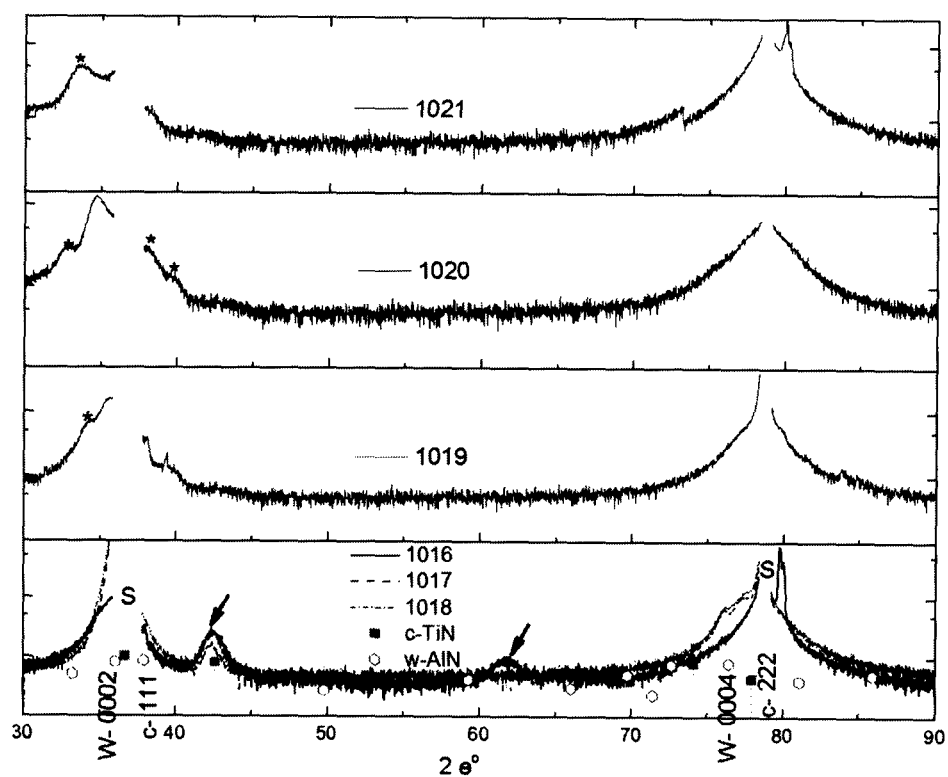

FIG. 6 shows XRD pattern of comparative coatings (#1016, #1017, #1018), and inventive coatings (#1019, #1020, #1021). For the inventive coatings the XRD diffractogram shows only diffraction peaks corresponding to TiN c-111 and AlN w-0002. In the case of the comparative coatings, the XRD diffractogram shows diffraction peaks corresponding to TiN c-002, and c-TiN 220. These observations suggest, in the comparative coatings comprise interfaces between the layers of c-TiN and w-AlN which are incoherent.

Figure 8:
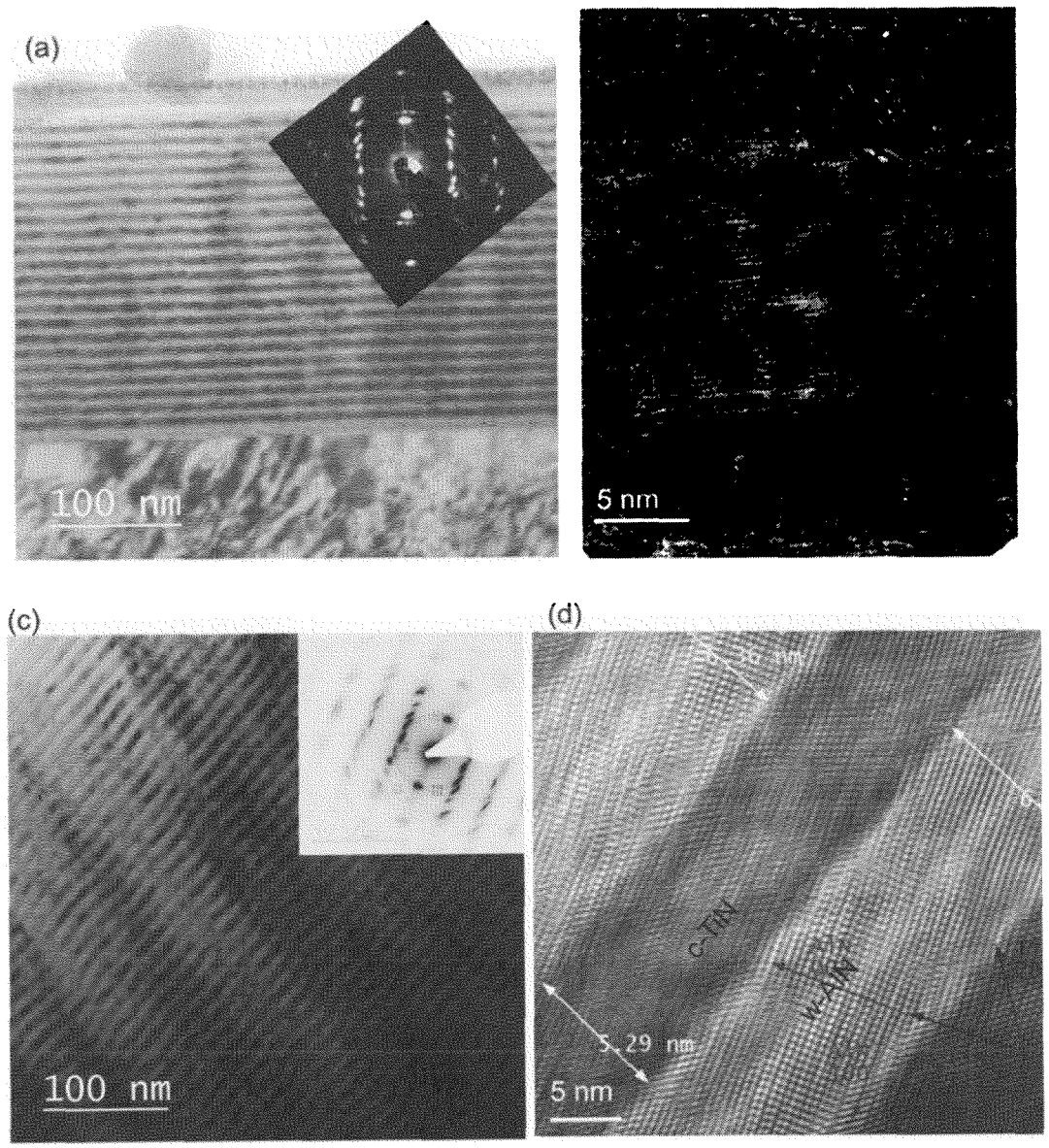

FIG. 8 shows TEM images of a comparative coating and an inventive coating. In the HR-TEM image shown in FIG. 8d it is possible to observe that the inventive coatings lattice fringes are continues, suggesting (semi-) coherent interfaces.

Where as in case of comparative coatings, the lattice fringes are discontinues suggesting incoherent interfaces.

Figure 9:
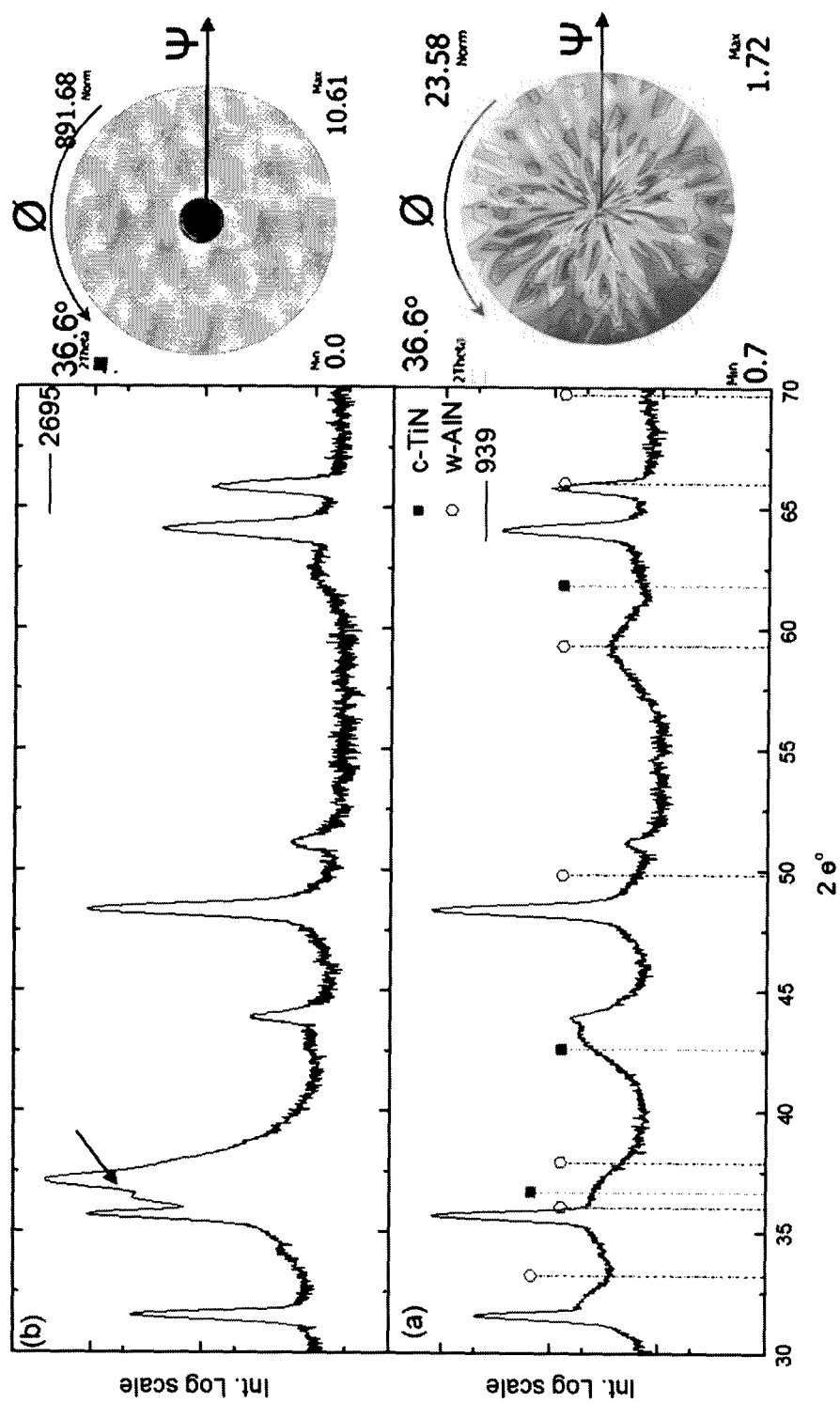

FIG. 9 shows XRD e-2e diffractograms of multilayers with c-TiN/w-AlN on polycrystalline substrates, and pole figures at 2e position of 36.6°, corresponding to c-TiN 111, and w-AlN 0002. The pole figure of the inventive coating in FIG. 9b indicates a high preferred orientation of c-111. This information combining with presence of only w-AlN 0002 in the XRD of FIG. 9b suggests (semi-) coherent interfaces between the layers of c-TiN, and w-AlN layers for inventive coatings similar to what has been shown in HR-TEM image in FIG. 8d. In case of example coating in FIG. 9a, the pole figure shows random orientation of 111, and XRD shows mixture of c-111, c-002, and w-11-20 diffraction peaks, suggesting the layers have incoherent interfaces.

The current invention shows concretely how to achieve c-TiN and w-AlN multilayer coatings with (semi-) coherent interfaces on both single crystalline and poly-crystalline substrates.

Figure 10:
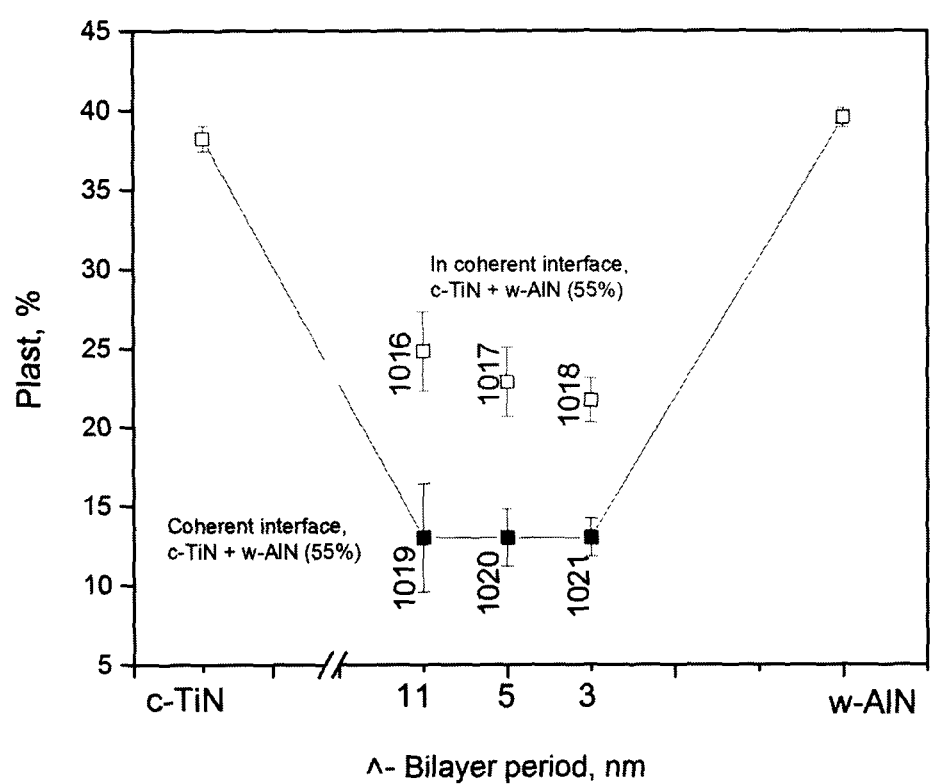
Figure 11:
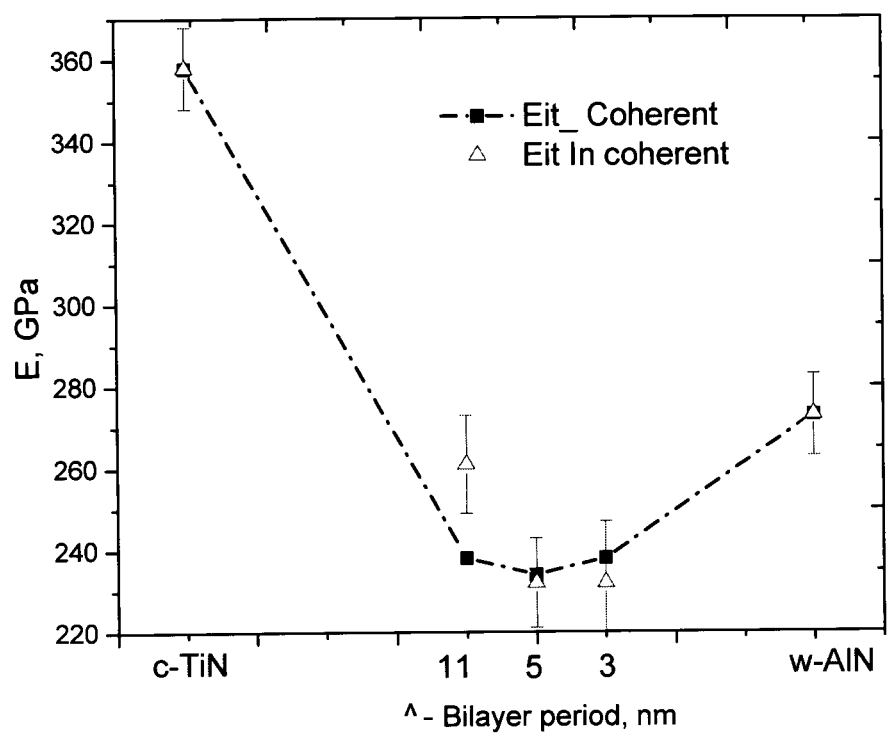

In addition, the current invention also reveals that when the c-TiN and w-AlN forms a (semi-) coherent interface, the plasticity (plasticity should be understood as the ability to deform a material plastically) of the coatings is considerable low with a value of 12.5% as shown in FIG. 10. It can be also noted that the values of Elastic modulus of the comparative coatings with incoherent interfaces and the inventive coatings with (semi-) coherent interfaces are comparable as shown in FIG. 11. This means that the hardness enhancement of about 7 GPa in FIG. 12 for inventive coatings with (semi-) coherent interfaces compared to example coatings is surprisingly solely due to the modified interface structure. Furthermore, it can be noted that the hardness enhancement is almost independent of the lattice period with in the investigated ranges between 11 nm and 3 nm.

Figure 12:
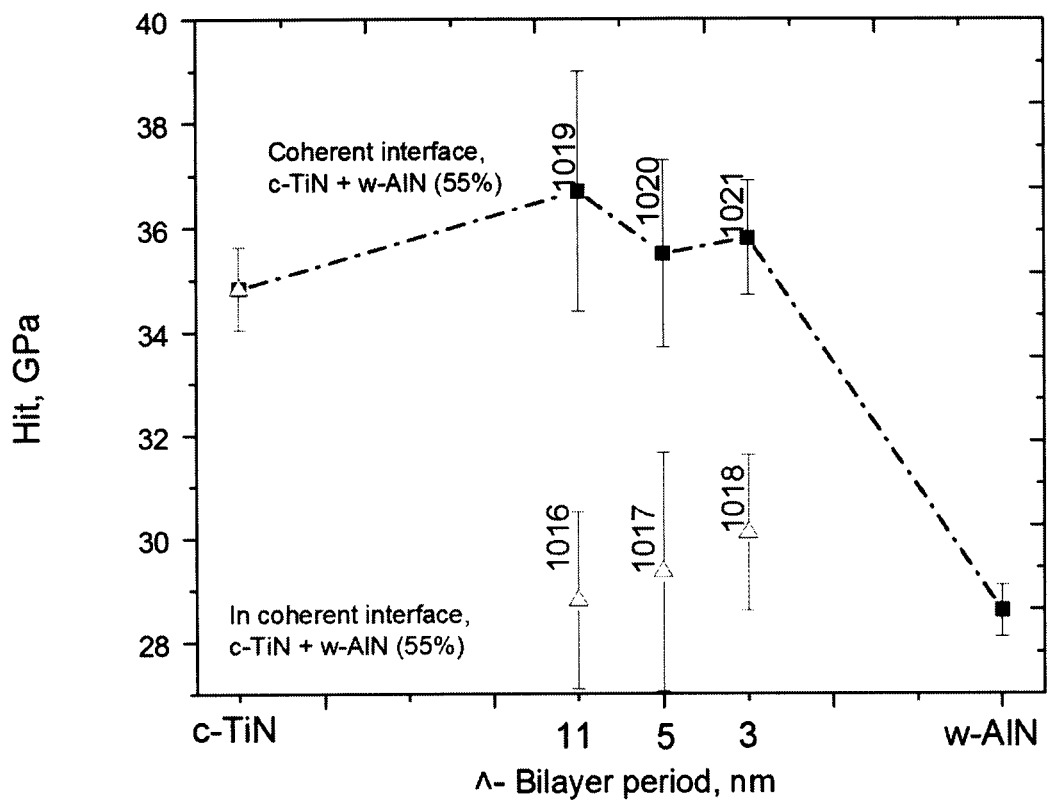

The values of plasticity, E modulus and hardness shown in FIGS. 10, 11 and 12, were measured by using nanoindentation techniques. Concretely a load-controlled nanoindenter equipped with a Berkovich diamond indenter with a tip radius of approximately 130 nm was used. The indenter tip area function was calibrated using a fused silica reference sample with compliance correction, and the data were corrected for thermal drift. An optimum load of 10 mN was selected to avoid substrate effects and to obtain load independent mechanical properties. A minimum of 30 indents were made on the coatings.

Even though, here the invention is presented in TiN/AlN modulated structure, experts in the field realize that the invented process window is easily deployable in other materials such as c-VN/w-AlN, c-CrN/w-AlN, c-NBN/w-AlN similarly for other TMN.

Further Details of the Examined Comparative and Inventive Coatings:

Inventive coatings identified with the numbers #1019, #1020 and #1021 within the present description are multilayers with different periodicity showing only c-111 and w-0001, and having (semi-) coherent interfaces between non-isostructural layers with an orientation relationship of c-1111 w-0001 and showing thickness fringes indicating coherent interfaces between layers.

Comparative coatings identified with the numbers #1016, #1017 and #1018 within the present description are multilayers showing additional diffraction peaks corresponding to TiN c-002, and c-220 indicating incoherent interfaces between layers.

Description of the Examined Coatings:

| Examples | Coating Number # | Bi-layer period thickness, [nm] | XRD description | Interfaces between c-TiN, and w-AlN |
|---|---|---|---|---|
| Comparative coating 1 | 1016 | 11 | Additional peaks of c-002, and c-311 | Incoherent |
| Comparative coating 2 | 1017 | 5 | Additional peaks of c-002 | Incoherent |
| Comparative coatings 3 | 1018 | 3 | Additional peaks of c-002 | Incoherent |
| Inventive coating 1 | 1019 | 11 | Only diffraction peaks of c-111 and w-0002. No additional peaks | Semi-coherent |
| Inventive coating 2 | 1020 | 5 | Only diffraction peaks of c-111 and w-0002. No additional peaks | Semi-coherent |
| Inventive coating 3 | 1021 | 3 | Only diffraction peaks of c-111 and w-0002. No additional peaks | Semi-coherent |

Used coating process parameters for producing the comparative coatings #1016, #1017, #1018 and the inventive coatings #1019, #1020, #1021

| | Ar Partial pressure, Pa | Total pressure, Pa | O2 flow, SCCM | Bias, Voltage, V | Peak power on Ti Target, kW | Peak power on Al targets, kW | Substrate temp. Ts, °C. | Pulse length of Ti TGT, ms | Pulse length Al TGT ms |
|---|---|---|---|---|---|---|---|---|---|
| Example coatings (1016, 1017, 1018) | 0.2 | 0.35 | 0 | 80 | 45 | 45 | 350 | 30 | 30 |
| Inventive coatings (1019, 1020, 1021) | 0.2 | 0.25 | 10 | 60 | 45 | 45 | 350 | 30 | 0.5 |

As shown in FIG. 9b it can be noted that the inventive coating #2695 exhibits strong 111 texture, combined this with the absence of other diffraction peaks from cubic and wurtzite phases in the diffractogram suggesting coherent interfaces between the layers.

As shown in FIG. 9a it can be noted that the comparative coating #939 exhibits random orientation of c-TiN 111 plane in pole figure, suggestive of incoherent interfaces.

Used coating process parameters for producing the comparative coatings #939 and the inventive coatings #2695

| | Ar Partial pressure, Pa | Total pressure, Pa | O2 flow, SCCM | Bias, Voltage, V | Peak power on Ti Target, kW | Peak power on Al targets, kW | Substrate temp. Ts, °C. | Pulse length of Ti target, ms | Pulse length of Al target, ms | TiN interl nm |
|---|---|---|---|---|---|---|---|---|---|---|
| Comparative coatings #939 | 0.2 | 0.35 | 0 | 80 | 45 | 45 | 350 | 30 | 30 | 50 |
| Inventive coatings #2695 | 0.2 | 0.25 | 10 | 60 | 45 | 45 | 350 | 30 | 0.5 | 50 |

Further example of an inventive coating according to a preferred embodiment of the present invention:

For this inventive coating the growth temperature was increased up to 600° C., and a composite target of with composition Ti40Al50Si10 was used for forming the in-plane modulated structure with coherent interfaces between c-TiN and w-AlN, and a self-adapted diffusion barrier layer of SiNx phase as shown in FIG. 3.

Process parameters are shown below. The inventors suspect that the formation of such structure is promoted by the inherent drive to segregation of immiscible components of c-TiN, w-AlN, and SiNx. A high substrate temperature of 600° C., a lower total pressure of 0.35 Pa, combined with specific working parameters, facilitate the segregation, and formation of c-TiN, w-AlN, and SiNx, while the formation of (semi-) coherent interfaces is promoted by energy minimization criterion supported by a seed layer of c-TiN with 111 texture.

Coating process used for producing an inventive coating with self-adapted diffusion barrier layer of SiNx phase:

|  | Ar Partial pressure, Pa | Ar and N2 total Pressure, Pa | O$_2$ flow, SCCM | Bias, Voltage, V | Peak power on Ti40Al50Si10 Target, kW | Substrate temp. Ts | Pulse length, ms |
|---|---|---|---|---|---|---|---|
| In-plane modulated coating with self-adapted diffusion barrier | 0.2 | 0.35 | 10 | 60 | 45 | 600 | 30 |

The invented structures show a stable hardness as shown in FIG. 5, as no structural phases are foreseen at least up to a temperature of 1400 C. The diffusion barrier layer of SiNx suppress the grain growth, and confines the domain size, there by the coherent interfaces are preserved. There by a stable hardness is expected as shown in FIG. 5

In summary, the current invention shows how to achieve in plane and out-of-plane modulated structure consisting of c-TMN and w-AlN domains with (semi-) coherent interfaces, and self-adapted diffusion barrier layer of SiNx phase on both single crystalline and poly-crystalline substrates.

The invention reveals by forming such coherent or (semi-) coherent interfaces, combined with chemical modulation high resistance to plasticity is achieved with a value of 12%, and the reduced plasticity is retained till high temperatures.

The present invention discloses in particular:

A component comprising a substrate coated with a coating having a film (3,4 or 3,4,5) comprising one or more transition metals, TM, aluminium, Al, and nitrogen, N, wherein the TM and N as well as Al and N are comprised in the film forming respectively nitride compounds, wherein the transition metal nitride, TM-N, is present in the film distributed in different portions exhibiting one crystalline phase of TM-N, and the aluminium nitride, Al—N, is present in the film in different portions exhibiting one phase of Al—N, Wherein:
the phase of the transition metal nitride is cubic, c-TMN, the phase of the aluminium nitride is wurtzite, w-AlN, and
wherein the film exhibits coherent or (semi-) coherent interfaces between the c-TMN phase portions and the w-Al—N phase portions.

A component according to the embodiment described above, wherein a compound (5) with diffusion barrier properties is present at the interfaces between the c-TMN phase portions and the w-Al—N phase portions.

A component according to any of the two embodiments described above, wherein the substrate (1) is a polycrystalline material and a seed layer (2) is deposited between the substrate (1) and the film.

A component according to any of the previous embodiments described above, wherein the component is a tool, in particular a cutting tool.

The invention claimed is:

1. Component comprising: a substrate coated with a coating having a film comprising one or more transition metals, TM, aluminium, Al, and nitrogen, N, wherein the TM and N as well as Al and N are comprised in the film forming respectively nitride compounds, wherein the transition metal nitride, TM-N, is present in the film distributed in different portions exhibiting one crystalline phase of TM-N, and the aluminium nitride, Al—N, is present in the film in different portions exhibiting one phase of Al—N,
characterized in that
the phase of the transition metal nitride is cubic, c-TMN,
the phase of the aluminium nitride is wurtzite, w-AlN,
wherein the film exhibits coherent or semi-coherent interfaces between the c-TMN phase portions and the w-AlN phase portions, and
a diffusion barrier layer having a compound with diffusion barrier properties is present at the interfaces between the c-TMN phase portions and the w-AlN phase portions, acting as a diffusion barrier interface between the c-TMN and the w-AlN phases.

2. Component of claim 1, wherein the substrate is a polycrystalline material and a seed layer is deposited between the substrate and the film.

3. Component of claim 1, wherein the diffusion barrier layer comprises SiN, BN and/or WN.

4. Component of claim 1, wherein the component is a tool or a cutting tool.

5. Hot work device comprising a polycrystalline substrate coated with a PVD hard coating exhibiting stability, by exhibiting high hardness, in the temperature range between 800° C. and 1100° C.,
characterized in that
the PVD hard coating comprises
a seed layer embodied as a w-AlN layer deposited directly on the polycrystalline substrate, and
one single coating structure or at least one coating structure deposited on the seed layer, the coating structure having c-TMN and w-AlN phases with coherent or semi-coherent interfaces between the phases, wherein a diffusion barrier layer having a compound with diffusion barrier properties is present at the interfaces between the c-TMN phases and the w-Al—N phases, acting as a diffusion barrier interface between the c-TMN and the w-AlN phases.

6. Hot work device of claim 5, wherein the hot work device is embodied as a tool for milling or pressing.

7. Hot work device of claim 5, wherein the diffusion barrier layer comprises SiN, BN and/or WN.

8. Method for producing polycrystalline substrates coated with a PVD hard coating exhibiting stability, by exhibiting high hardness, in the temperature range between 800° C. and 1100° C.,
characterized in that
a seed layer embodied as a w-AlN layer is deposited on a surface of the polycrystalline substrate, in such a manner that the seed layer exhibits a crystallographic orientation w-(0001), or w-(10-10), or w-(11-20), and after completion of the seed layer, one single coating structure or at least one coating structure having c-TMN and w-AlN phases with coherent or semi-coherent interfaces between the phases is deposited,
wherein a diffusion barrier layer having a compound with diffusion barrier properties is present at the interfaces between the c-TMN phases and the w-AlN phases, acting as a diffusion barrier interface between the c-TMN and the w-AlN phases.

9. Method of claim 8, wherein at least the deposition of the coating structure is carried out by maintaining a substrate temperature of maximum 600° C.

10. Method of claim 9, wherein at least the deposition of the coating structure is carried out by maintaining the substrate temperature below 500° C.

11. Method of claim 8, wherein the at least one coating structure is a compositional and structural modulated coating.

12. Method of claim 8, wherein the high hardness, in the temperature range between 800° C. and 1100° C., of the one single coating structure or an outermost coating structure corresponds to a hardness value above 35 GPa.

13. Method of claim 8, wherein the coating structure is a coating structure of c-TMN and w-AlN phases with a volume fraction between 70% and 100%.

14. Method of claim 8, wherein the coating structure is synthesized in a co-deposition method that way that the incident flux of TM and the incident flux of Al are co-deposited.

15. Method of claim 8, wherein an adatom mobility above 50 nm/s is provided for at least during deposition of at least one coating structure.

16. Method of claim 15, wherein the adatom mobility is achieved by attaining a high plasma density which is preferably accomplished by using a HIPIMS deposition or by combining such a HIPIMS deposition with an arc evaporation process.

17. Method of claim 15, wherein the adatom mobility is achieved by applying an asymmetric bipolar pulsed bias at the substrate.

18. Method of claim 15, wherein the adatom mobility is enhanced by using surfactants.

19. Method of claim 8, wherein the c-TMN phase domains and/or the w-AlN phase domains formed have a size between 5 nm and 20 nm.

20. Method of claim 8, wherein the c-TMN and w-AlN phase domains comprised in the coating structure exhibit an interface material volume up to 50%.

21. Method of claim 8, wherein the diffusion barrier layer comprises SiN, BN and/or WN.

22. Method of claim 8, wherein the coating structure is deposited in such a manner that the nitrogen content in the coating structure is replaced with oxygen in a proportion between 1 at. % and 20 at. %.

23. Method of claim 8, wherein the high hardness, in the temperature range between 800° C. and 1100° C., corresponds to a hardness value above 35 GPa.

* * * * *